US006890810B2

(12) United States Patent
Amadon et al.

(10) Patent No.: US 6,890,810 B2
(45) Date of Patent: May 10, 2005

(54) METHOD OF FABRICATION OF THIN FILM RESISTOR WITH ZERO TCR

(75) Inventors: Jeffrey R. Amadon, Poughkeepsie, NY (US); Anil K. Chinthakindi, Fishkill, NY (US); Kenneth J. Stein, Sandy Hook, CT (US); Kwong H. Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/727,946

(22) Filed: Dec. 4, 2003

(65) Prior Publication Data

US 2004/0241951 A1 Dec. 2, 2004

Related U.S. Application Data

(62) Division of application No. 10/250,075, filed on Jun. 2, 2003.

(51) Int. Cl.[7] .................... H01L 21/8238; H01L 29/76; H01L 29/94; H01L 31/062; H01L 31/113

(52) U.S. Cl. ....................... 438/210; 257/379; 257/532; 257/533; 257/536; 257/537

(58) Field of Search .......................... 438/210; 257/379, 257/532, 533, 536, 537

(56) References Cited

U.S. PATENT DOCUMENTS

| | | | | |
|---|---|---|---|---|
| 4,464,646 A | | 8/1984 | Zabler et al. | |
| 5,448,103 A | | 9/1995 | de Wit | |
| 5,643,834 A | * | 7/1997 | Harada et al. | 438/122 |
| 6,097,276 A | * | 8/2000 | Van Den Broek et al. | 338/9 |
| 6,272,736 B1 | | 8/2001 | Lee | |
| 6,603,172 B1 | * | 8/2003 | Segawa et al. | 257/328 |

* cited by examiner

*Primary Examiner*—Craig A. Thompson
*Assistant Examiner*—Nema Berezny
(74) *Attorney, Agent, or Firm*—Scully, Scott, Murphy & Presser; James J. Cioffi, Esq.

(57) ABSTRACT

A thin film resistor that has a substantially zero TCR is provided as well as a method for fabricating the same. The thin film resistor includes at least two resistor materials located over one another. Each resistor material has a different temperature coefficient of resistivity such that the effective temperature coefficient of resistivity of the thin film resistor is substantially 0 ppm/° C. The thin film resistor may be integrated into a interconnect structure or it may be integrated with a metal-insulator-metal capacitor (MIMCAP).

7 Claims, 4 Drawing Sheets

METHOD OF FABRICATION OF THIN FILM RESISTOR WITH ZERO TCR

RELATED APPLICATION

This application is a divisional of U.S. application Ser. No. 10/250,075, filed Jun. 2, 2003.

FIELD OF THE INVENTION

The present invention relates to semiconductor device manufacturing, and more particularly to a method of fabricating a thin film resistor having a substantially zero "0" temperature coefficient of resistivity (TCR). The present invention is also directed to a method of integrating the thin film resistor of the present invention with an interconnect structure and/or a metal-insulator-metal capacitor (MIMCAP).

BACKGROUND OF THE INVENTION

In semiconductor integrated circuits (ICs), a resistor may be used to control the resistance of other electronic components of the IC. As is known to those skilled in the art, the resistance, R, of a resistor is proportional to the length, L, of the resistor and the reciprocal cross sectional area, 1/A, of the resistor; the L and A are measured in the direction of current flow. The basic equation for resistance of a resistor is thus: R=L/A, where R, L and A are as defined above.

Prior art resistors are typically composed of polysilicon that has been doped. As the integration of semiconductor devices increases, each component within a semiconductor IC has to provide equivalent or better electrical properties. A downscaled resistor thus has to provide a constant resistance value that does not fluctuate much during use. However, due to the properties of polysilicon, a prior art resistor comprised of doped polysilicon can only provide a limited resistance within a limited space. Employing a polysilicon resistor to provide relatively high resistance then becomes a problem in designing and fabricating a highly integrated semiconductor device.

Recently, doped polysilicon resistors have been replaced with a single thin film resistor that is comprised of a material that has a higher resistivity than that of polysilicon. Examples of such higher resistivity materials include, but are not limited to: TiN and TaN. Tantalum nitride, TaN, containing 36% $N_2$ is a material currently being used in the back-end-of-the line (BEOL) of most semiconductor devices. Even though higher resistivity materials can be used to fabricate good resistors, they typically exhibit a very high temperature coefficient of resistivity, i.e., TCR, that is on the order of about −600 ppm/° C. TCR, which is the normalized first derivative of resistance and temperature, provides an adequate means to measure the performance of a resistor.

On account of the high TCR values of prior art single thin film resistors, the resistance of such resistors tends to fluctuate a lot when the resistor is used at normal operating temperatures of about 85° C.; resistance fluctuation hampers the performance of high-performance semiconductor IC devices. For example, if a resistor having a resistivity of 50 ohms is provided in a semiconductor IC, high TCR of the resistor may cause the resistance to vary as much as 15 to 20% from the desired resistance of 50 ohms as it is being used and heated up via Joule heating. As such, the 50-ohm resistor is not operating at the resistance value it was intended to operate at.

In view of the state of the art mentioned above, there is a need for providing new and improved resistors that have a targeted sheet resistance and a TCR value that is substantially zero. The term "substantially zero" is used in the present invention to denote a TCR value that is within ±50 ppm/° C. from zero.

SUMMARY OF THE INVENTION

An object of the present invention is to provide a thin film resistor that has a targeted sheet resistance, which exhibits little or no fluctuation in resistance during use.

A further object of the present invention is to provide a thin film resistor having a temperature coefficient of resistivity, i.e., TCR, which is closer to 0 ppm/° C. than is a conventional single thin film resistors. As stated above, TCR of a resistor may be calculated by normalizing the first derivate of resistance and temperature.

A yet further object of the present invention is to provide a thin film resistor in which the overall resistance is equivalent to at least two resistors that are connected in parallel.

A still further object of the present invention is to provide a thin film resistor that can be integrated directly within one of the interconnect levels of an interconnect structure, while targeting a desired sheet resistance and a TCR that approaches 0 ppm/° C.

An even further object of the present invention is to provide a thin film resistor that can be interconnected to various wiring levels of an interconnect structure using the metal vias as the interconnect means, while targeting a desired sheet resistance and a TCR approaching 0 ppm/° C.

A yet further object of the present invention is to provide a thin film resistor having a targeted sheet resistance and a TCR approaching 0 ppm/° C. that can be integrated with a metal-insulator-metal capacitor (MIMCAP) at the same interconnect level.

These and other objects and advantages are achieved in the present invention by providing a thin film resistor that has a substantially zero TCR. As stated above, the term "substantially zero" when used in conjunction with the term TCR denotes a TCR value that is within ±50 ppm/° C. from 0 ppm/° C. The term "thin film resistor" denotes a resistor whose overall thickness is less than about 1000 Å.

Specifically, and in broad terms, the thin film resistor of the present invention comprises at least two resistor materials located over one another, each resistor material having a different temperature coefficient of resistivity wherein the different temperature coefficients of resistivity provide an effective temperature coefficient of resistivity that is substantially 0 ppm/° C.

The effective temperature coefficient of resisitivity and the total resistance of the thin film resistor of the present invention are not based on the sum of the individual TCR and resistance values of the resistor materials. Instead, the $TCR_{eff}/R_{eff}$ is the sum of the individual (TCR/R) for each of the resistor materials present in the film, wherein $(1/R_{eff})$ is given by the sum of individual (1/R) for each of the resistor materials present in the thin film resistor. For example, and for a resistor containing two resistor materials, the effective TCR of the resultant bilayer thin film resistor would be determined by the following equation: $TCR_{eff}/R_{eff}=(TCR1/R1)+(TCR2/R2)$, where $1/R_{eff}=(1/R1)+(1/R2)$.

A selected and targeted sheet resistance can be provided to the thin film resistor of the present invention by selecting appropriate resistor materials that have a sheet resistance that provides the selected and targeted value. The thin film resistor of the present invention may include an insulating material located between portions of the resistor materials in which the outermost edges of the insulating material does not extend beyond the outermost edges of the at least two resistor materials. The insulating material is used in the present invention to reduce the interfacial resistance between overlying resistor materials as well as to preserve the morphology of the upper resistor material.

Although the thin film resistor may comprise a plurality of resistor materials stacked one over another, it is preferred in the present invention to provide a thin film resistor that comprises two resistor materials, RM1 and RM2. In this embodiment of the present invention, RM1 has a TCR value, TCR1, that is different from the TCR value (TCR2) of RM2 and the effective TCR of the bilayer resistor is substantially 0 ppm/° C.

The thin film resistor of the present invention may be integrated within an interconnect structure or it may be integrated with a MIMCAP at the same interconnect level. In the MIMCAP integration, the bottom most resistor material is also the bottom plate electrode of the MIMCAP, while the upper most resistor material is also the upper plate electrode of the MIMCAP.

Another aspect of the present invention relates to a method of fabricating the aforementioned thin film resistor of the present invention. Specifically, and in broad terms, the inventive thin film resistor is fabricated by a method, which includes:

forming at least two resistor materials over one another, each resistor material having a different temperature coefficient of resistivity wherein the different temperature coefficients of resistivity provide an effective temperature coefficient of resistivity that is substantially 0 ppm/° C.; and patterning the at least two resistor materials to provide a thin film resistor having a selected dimension.

A single or dual damascene process may then be used to connect the thin film resistor to intermediate metal levels and to active devices and vias.

The present invention also contemplates a method for integrating the inventive thin film resistor with a MIMCAP. This aspect of the present invention includes the step of:

forming a first resistor material having a first temperature coefficient of resistivity on a surface of a substrate;

forming an insulating material atop the first resistor material;

patterning the insulating material to at least provide a capacitor dielectric on a portion of the first resistor material;

forming a second resistor material having a second temperature coefficient of resistivity which is different from the first temperature coefficient of resistivity over the first resistor material and the capacitor dielectric, with the proviso that the first temperature coefficient of resistivity and the second temperature coefficient of resistivity provide an effective temperature coefficient of resistivity that is substantially 0 ppm/° C.; and patterning the first and second resistor materials to provide a thin film resistor and a capacitor, said capacitor including at least the capacitor dielectric.

DETAILED DESCRIPTION OF THE INVENTION

Figure 1A:
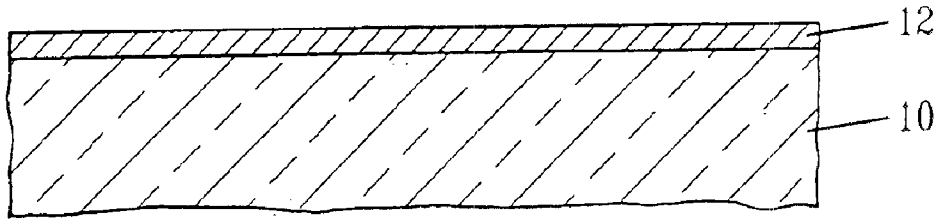
FIGS. 1A–1D are pictorial representations (through cross sectional views) illustrating the basic processing steps that are employed in the present invention for fabricating a thin film resistor that has a substantially zero TCR.

The present invention, which provides a thin film resistor having a substantially zero TCR, will now be described in greater detail by referring to the drawings that accompany the present application. In the accompanying drawings, like and corresponding elements are referred to by like reference numerals. Although the drawings show the presence of two resistor materials, the present invention is not limited to resistors having only two layers. Instead, the present invention works equally well in forming a plurality of resistor materials, one over the other, in which the TCR value of the various resistor material layers is substantially zero TCR.

As stated above, the present invention provides a thin film resistor that has a substantially zero TCR. The thin film resistor of the present invention includes at least two resistor materials located over one another. Each resistor material has a different temperature coefficient of resistivity which provides an effective temperature coefficient of resistivity that is substantially 0 ppm/° C. The method of forming the inventive thin film resistor will now be described in greater detail by referring to FIGS. 1A–1D.

Specifically, FIG. 1A illustrates an initial structure that is fabricated after forming a first resistor material 12 on a surface of substrate 10. The substrate 10 includes any semiconductor material or any dielectric material which is typically present in an interconnect structure. The dielectric material may serve as a hard mask, interlevel dielectric or intralevel dielectric of an interconnect structure.

Examples of suitable semiconductor materials for the substrate 10 include, but are not limited to: Si, SiGe, SiC, SiGeC, Ge, GaAs, InAs, InP, all other III/V compound semiconductors as well as layered semiconductors such as silicon-on-insulators (SOIs) or SiGe-on-insulators (SGOIs). Illustrative examples of dielectric materials for the substrate 10 include, but are not limited to: porous or non-porous inorganic and/or organic dielectrics. Thus, the dielectric material may be comprised of SiN, $Sio_2$, a polyimide polymer, a siloxane polymer, a silsesquioxane polymer, diamond-like carbon materials, fluorinated diamond-like carbon materials and the like including combinations and multilayers thereof.

Substrate 10 may include various device regions, isolation regions, and/or wiring regions. These various regions are not illustrated in FIG. 1A, but are nevertheless meant to be included in or on substrate 10. The thickness of the substrate 10 is inconsequential to the method of the present invention. The substrate 10 may be single crystal or polycrystalline and it may be formed using various techniques that are well known to those skilled in the art.

First resistor material 12 is formed on a surface of the substrate 10 by utilizing a deposition process such as, for example, sputtering, plating, evaporation, chemical vapor deposition (CVD), plasma enhanced chemical vapor deposition (PECVD), chemical solution deposition, atomic layer deposition and other like deposition processes. The first resistor material 12 typically has a thickness, after deposition, of from about 50 to about 1000 Å, with a thickness of from about 50 to about 500 Å being more highly preferred.

The first resistor material 12 may comprise Ta, TaN, Ti, TiN, W, WN, and other like resistor materials. The first resistor material 12 has a first sheet resistance value and a first TCR value. The TCR value may be positive or negative depending on the type of resistor material used, and the sheet resistance is also dependent on the type of material used as well as its length and area.

Figure 1B:
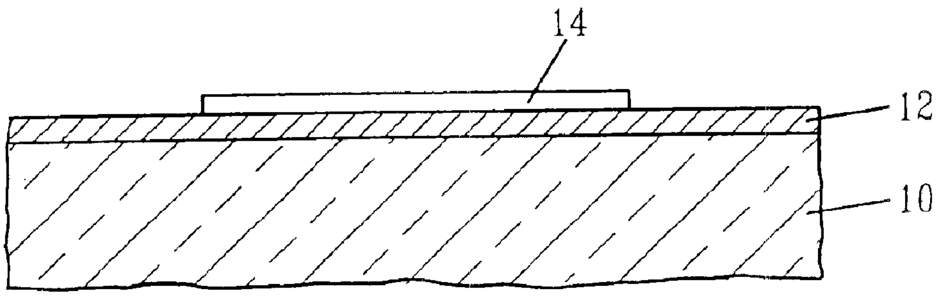

Next, an optional insulating material 14 may be formed on an upper exposed surface of the first resistor material 12 and then patterned to provide the structure shown, for example, in FIG. 1B. The optional insulating material 14, which may comprise an oxide, nitride, oxynitride or any combination thereof including multilayers, is formed by a deposition process such as CVD, PECVD, chemical solution deposition, atomic layer deposition and other like deposition processes. Alternatively, the optional insulating material 14 may be formed by oxidation, nitridation or oxynitridation. A highly preferred optional insulating material 14 employed in the present invention is SiN.

When present, the optional insulating material 14 has a thickness of from about 50 to about 500 Å, with a thickness of from about 100 to about 300 Å being more highly preferred. The optional insulating material 14 minimizes any intermetallic formation between the first resistor material 12 and the overlying second resistor material 16, to be described in greater detail hereinbelow. Also, since the overlying second resistor material 16 is formed over a dielectric material instead of another resistor material, the morphology and the electrical properties of the overlying second resistor material 16 are expected to be near its' intrinsic, i.e., single film value.

After forming the optional insulating material 14 atop the first resistor material 12, the optional insulating material 14 is patterned to provide the structure shown in FIG. 1B. Patterning of the optional insulating material 14 is performed utilizing a lithography step, followed by etching. The lithography step includes applying a photoresist (not shown) to the surface of the optional insulating material 14, exposing the photoresist to a desired pattern of radiation and developing the pattern into the photoresist by utilizing a conventional resist developer. The pattern is then transferred to the optional insulating material 14 by an etching step that includes a wet etch process, a dry etch process or any combination thereof. After pattern transfer, the photoresist is removed utilizing a conventional photoresist stripping process that is well known to those skilled in the art.

Figure 1C:
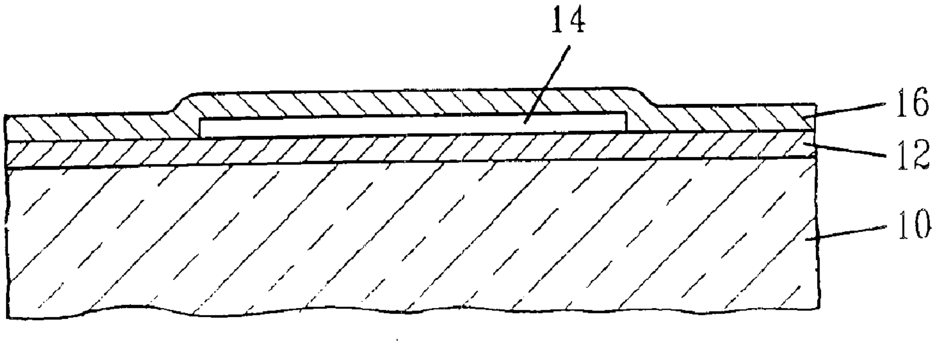
Figure 1D:
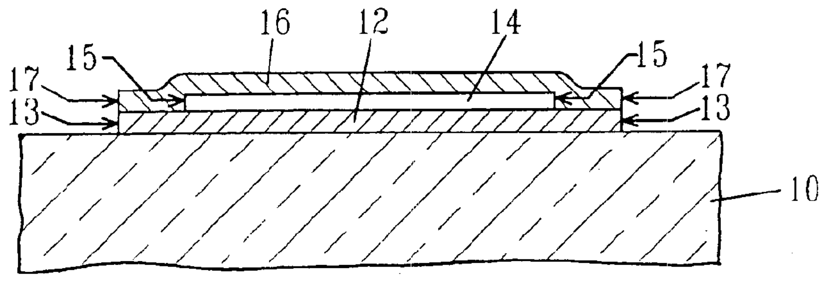

To either the structure shown in FIG. 1A or FIG. 1B, a second resistor material 16 is applied to the exposed surfaces, i.e., exposed surface of the first resistor material 12 and exposed surface of the optional insulating material 14, utilizing the same or different deposition process that was used in forming the first resistor material 12. FIG. 1C provides an illustration in which the second resistor material 16 is formed atop the structure shown in FIG. 1B.

The second resistor material 16 typically has a thickness, after deposition, of from about 50 to about 1000 Å, with a thickness of from about 50 to about 500 Å being more highly preferred. Moreover, the second resistor material 16 may comprise Ta, TaN, Ti, TiN, W, WN, and other like resistor materials, with the proviso that the second resistor material 16 is different from the first resistor material 12. The second resistor material 16 has a second sheet resistance value and a second TCR value, which are both different from the first resistor material 12. The second TCR value may be positive or negative depending on the type of resistor material used, and the sheet resistance is also dependent on the type of material used as well as its length and area. More importantly however is that the second TCR value and the first TCR value are selected to provide an effective TCR that is substantially 0 ppm/° C. In embodiments in which multiple resistor material are formed on each other, the effective TCR value of the multistack resistor is substantially 0 ppm/° C.

An example of a preferred resistor that can be formed in the present invention is a bilayer resistor stack in which the first resistor material 12 is TiN having a sheet resistance of 550 ohm/sq and a TCR of −650 ppm/° C. and the second resistor material 16 is TiN having a sheet resistance of 180 ohm/sq and a TCR of 290 ppm/° C. This combination of materials provides a thin film resistor that has an effective TCR value that is substantially zero. After forming the second resistor material 16 atop the structure, a patterning step, including lithography and etching, may be used to pattern the resistor materials on the surface of the substrate 10. It should be noted herein the when the optional insulating material 14 is present the outer edges 15 thereof do not extend beyond the outer edges 13 and 17 of first and second resistor materials 12 and 16, respectively. The structure after patterning is illustrated, for example, in FIG. 1D.

A multistack thin film resistor may be formed by repeating the steps of resistor material deposition and optional insulating material formation. The method of the present invention may be used to form a plurality of thin film resistors, with or without insulating material 14, on the surface of the substrate 10. In some embodiments, it is possible to form thin film resistors of the present invention having the insulating material, while other thin films resistors of the present invention do not contain the insulating material between resistor materials.

The above description, with reference to FIGS. 1A–1D, describes the basic processing steps of the present invention used in fabricating a thin film resistor having a substantially 0 TCR. The following description, with reference to FIGS. 2A–2F, describes the basic processing steps used in integrating the thin film resistor of the present invention in an interconnect structure in which an optional MIMCAP is formed at the same level as thin film resistor.

It is noted that even though the drawings include the MIMCAP, the interconnect structure does not need to contain the same. In such an embodiment, the thin film resistor of the present invention is formed in one of the interconnect levels of the interconnect structure. It is also noted that the following description forms the thin film resistor atop the first metal level. Although illustration is provided for forming the thin film over the first metal level, the present invention can also be used to form the thin film resistor in any of the interconnect levels over any of the metal levels.

Figure 2A:
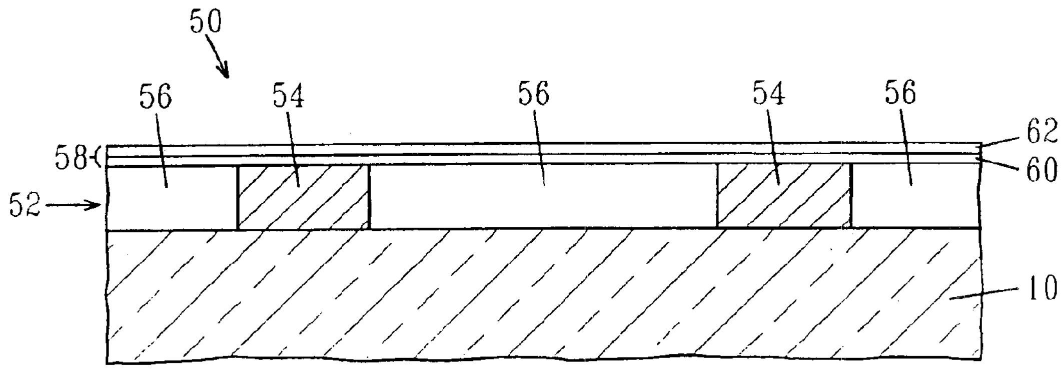
FIGS. 2A–2F are pictorial representations (through cross sectional views) illustrating an embodiment of the present invention in which the thin film resistor processing scheme illustrated in FIGS. 1A–1D is integrated into an interconnect structure. The interconnect structure also includes a MIMCAP at the same interconnect level.

FIG. 2A illustrates an initial interconnect structure 50 that may be used in this embodiment of the present invention. The initial interconnect structure 50 includes semiconductor substrate 10 having first metal level 52 formed thereon. The initial interconnect structure 50 may also include a material stack 58 comprised of an etch stop material 60 and a hard mask material 62 atop the first metal level 52. The material stack 58 is optional and need not be used in some embodiments. The first metal level 52 includes wiring regions 54 that are separated by dielectric 56.

The initial interconnect structure 50 shown in FIG. 2A is formed by using conventional back-end-of the line (BEOL), i.e., interconnect, schemes that are well known to those skilled in the art. Specifically, to a surface of the semiconductor substrate 10 is provided a metal level 52 that comprises wiring regions 54 that are separated from each other by dielectric 56. The metal level 52 may be formed by first forming wiring regions 52 on selected surfaces of semiconductor substrate 10 (by deposition and patterning) and thereafter forming a dielectric 56 over the entire structure include semiconductor substrate 10 and wiring regions 54. A planarizing process may be used to provide a structure having substantially co-planar surfaces. Alternatively, the metal level 52 may by formed by first providing dielectric 56 atop the semiconductor structure, patterning the dielectric 56 to provide openings for wiring regions 54 and then filling the openings with a conductive material and, if needed, subjecting the structure to planarization.

Notwithstanding which of these techniques is used in forming metal level 52, the wiring regions 54 are typically comprised of a conductive material including, for example, an elemental metal, a metal alloy or a metal silicide. Examples of suitable conductive materials for wiring regions 54 include, but are not limited to: Cu, Al, Ta, TaN, W and alloys or silicides thereof. The dielectric 56 is comprised of any interlevel inorganic or organic dielectric that may or may not be porous. An example of such a dielectric is $SiO_2$.

After providing the metal level 52, the optional material stack 58 may be formed atop the metal level 52 utilizing a conventional deposition process. As stated above, the material stack 58 comprises an etch stop material 60, such as SiN, and a hard mask material 62, such as $SiO_2$, deposited atop the first metal level 52.

Figure 2B:
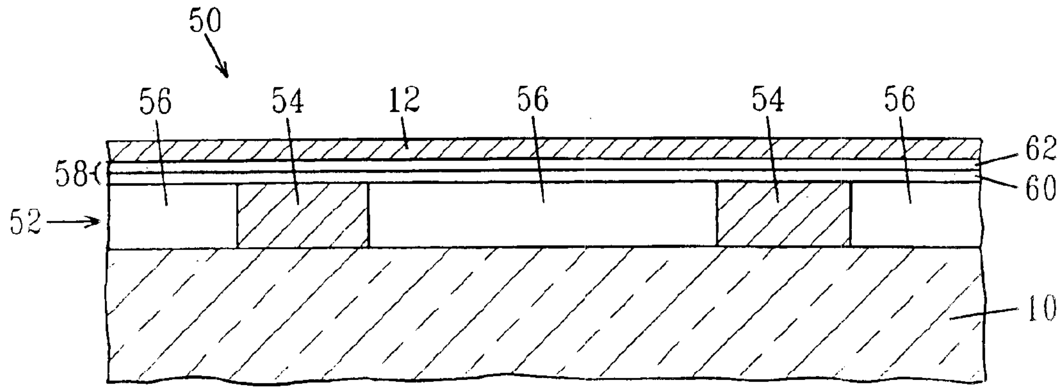

Next, and is shown in FIG. 2B, first resistor material 12 is formed atop the material stack 58, or if the material stack is absence, then the first resistor material 12 is formed atop the wiring level 52. The first resistor material 12 is formed as described above and it is composed of one of the resistor materials described above.

Figure 2C:
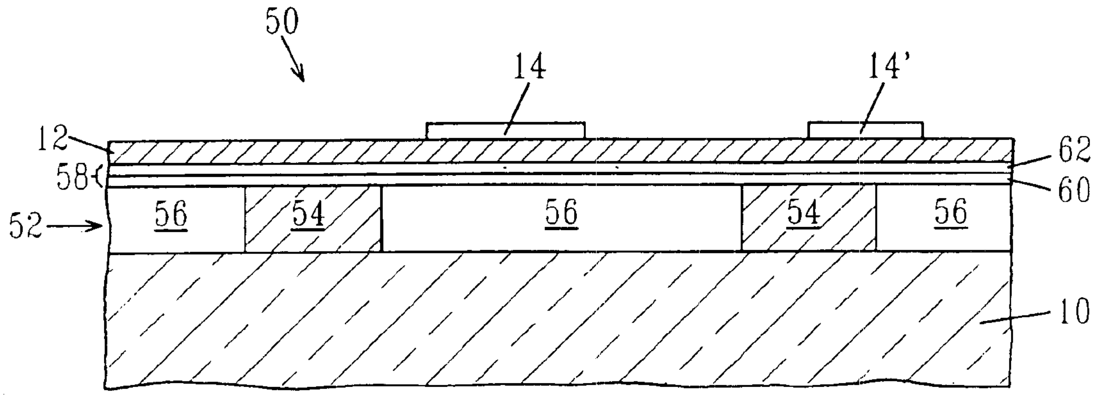

Next, optional insulating material 14 is formed atop the first resistor material 12 and then the optional insulating material 14 is patterned. The patterning may be used to form at least a capacitor dielectric 14' from the insulator material 14 in the regions in which the MIMCAP will be formed. In the drawings, the optional insulating material 14 is present in the thin film resistor as well. The resultant structure including the optional insulating material 14 and capacitor dielectric 14' is shown in FIG. 2C. It is noted that the optional insulating material 14 may be required in embodiments in which the MIMCAP is integrated with the thin film resistor of the present invention. In some cases, the capacitor dielectric 14' is different from the optional insulating material 14. In that embodiment, a separate dielectric from the optional insulating material 14 is deposited and patterned at the same time as the optional insulating material 14.

Figure 2D:
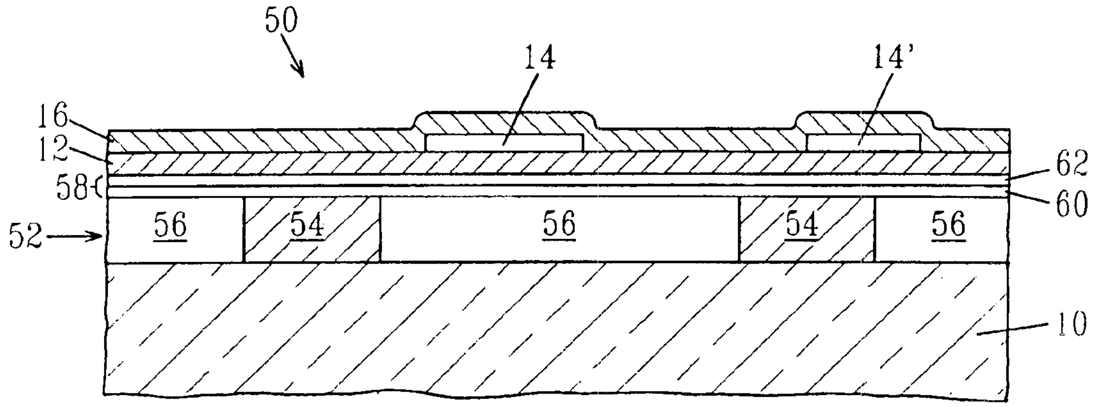

Next, and as shown in FIG. 2D, second resistor material 16 is formed atop the structure shown in FIG. 2C. The second resistor material 16 has the characteristics described above and it is formed utilizing one of the above mentioned deposition processes.

Figure 2E:
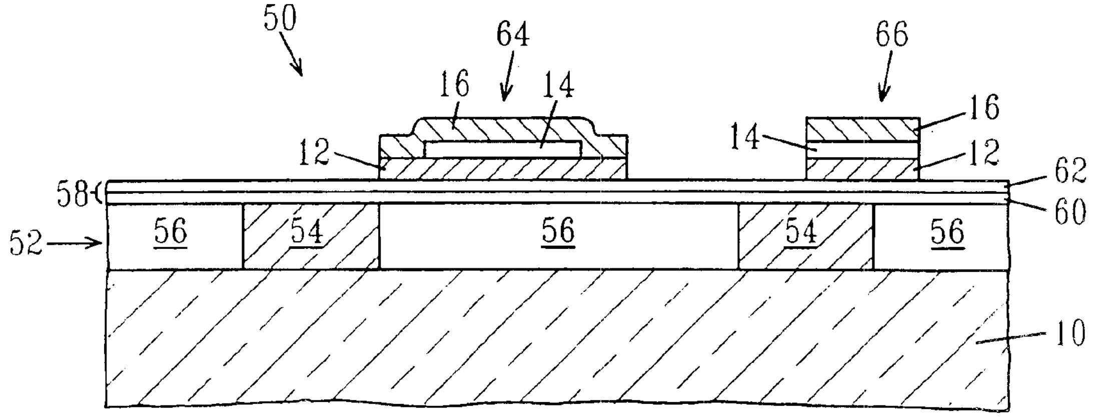

The structure shown in FIG. 2D is then subjected to an etching step in which at least the first resistor material 12 and the second resistor material 16 are etched to provide at least a thin film resistor 64. An optional MIMCAP 66 may also be formed during this etching step. FIG. 2E illustrates a structure that is formed after the etching step. As shown, the thin film resistor 64 includes first resistor material 12, optional insulating material 14 and second resistor material 16, while the MIMCAP 66 includes first resistor material 12, capacitor dielectric 14' and second resistor material 16. This etching step used in providing the structure shown in FIG. 2E comprises a dry etching process such as reactive-ion etching, ion beam etching, and laser ablation. A plurality of thin film resistors 64 and MIMCAPS 66 is also contemplated by the present invention.

An optional capping layer (not specifically shown) may be formed atop the second resistor material 16 prior to etching. If present, the etching step described above must also selectively etch the capping layer. The optional capping layer is comprised of any insulating material such as, for example, a nitride.

Figure 2F:
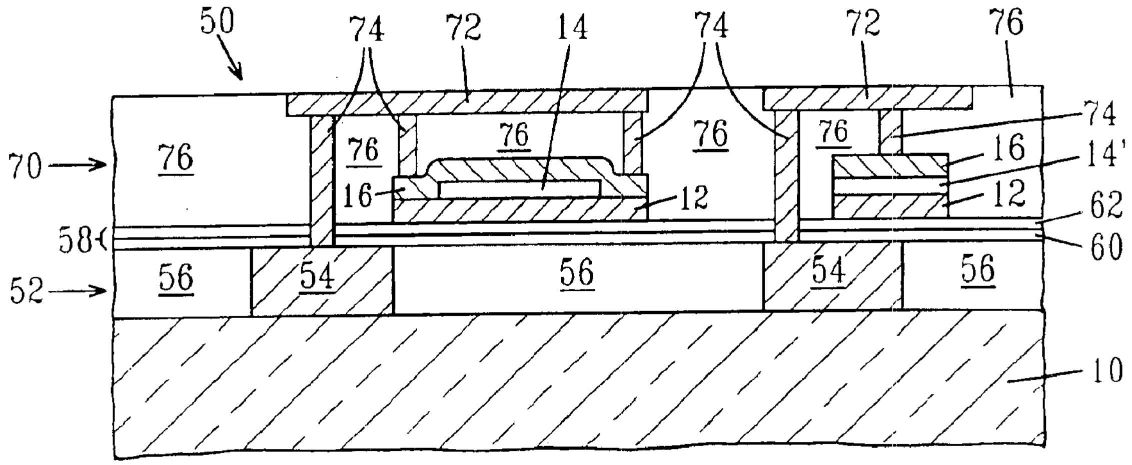

Next, and as shown in FIG. 2F, second wiring level 70 having lines 72 and vias 74 present in a dielectric 76 is formed atop the structure shown in FIG. 2E. The second wiring level may be formed utilizing a conventional single or dual damascene process that are both well known to those skilled in the art. The lines 72 and vias 74 may be comprised of the same or different conductive materials as the wiring regions 54, while dielectric 76 may be comprised of the same or different dielectric material as dielectric 56.

As is shown in FIG. 2F, the thin film resistor 64 and the MIMCAP 66 are connected to other wiring levels through vias and lines. The above procedure may be repeated to provide a multilevel interconnect structure.

Based on initial experiments, a thin film precision resistor with a target sheet resistance of 110 ohm/sq and TCR of ~50 ppm/° C. was fabricated using the method of the present invention. Specifically, the precision thin film resistor was fabricated by sequentially depositing TiN and TaN films. In particular, a 100 Å TiN film with a sheet resistance of 180 ohm/sq was sputter deposited over a silicon dioxide insulator material. 100 Å TaN film having a sheet resistance of 550 ohm/sq was then deposited over the TiN film. The resistor films were then patterned and were connected by dual damascene interconnections using standard semiconductor fabrication methods.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of fabricating a thin film resistor comprising:

forming a first resistor material on a substrate;

forming a patterned insulting material atop a portion of the first resistor material;

forming a second resistor material atop the patterned insulating material and the first resistor material, said second resistor material having a different temperature coefficient of resistivity than the first resistor material, wherein the different temperature coefficients of resistivity provide an effective temperature coefficient of resistivity that is substantially 0 ppm/° C.; and patterning at least the first resistor material and the second resistor material to provide a thin film resistor having a selected dimension.

2. The method of claim 1 further comprising connecting the first resistor material and the second resistor material to wiring levels of an interconnect structure.

3. The method of claim 2 wherein the connecting occurs through metal vias and lines.

4. A method integrating a thin film resistor with a metal-insulator-metal capacitor comprising the step of:

forming a first resistor material having a first temperature coefficient of resistivity on a surface of a substrate;

forming an insulating material atop the first resistor material;

patterning the insulating material to at least provide a capacitor dielectric on a capacitor portion of the first resistor material and a resistor dielectric on a thin film resistor portion of the first resistor material;

forming a second resistor material having a second temperature coefficient of resistivity which is different from the first temperature coefficient of resistivity over the first resistor material, the resistor dielectric and the capacitor dielectric, with the proviso that the first temperature coefficient of resistivity and the second temperature coefficient of resistivity provide an effective coefficient of resistivity that is substantially 0 ppm/° C.; and patterning the first and second resistor materials to provide a thin film resistor and a capacitor, said capacitor including at least the capacitor dielectric and said thin film resistor including the resistor dielectric.

5. The method of claim 4 wherein the at least two resistor materials are different materials selected from the group consisting of Ta, TaN, Ti, TiN, W, end WN.

6. The method of claim 4 wherein the at least two resistor materials comprise a first resistor material and a second resistor material.

7. The method of claim 4 wherein the first resistor material is TiN and the second resistor material is TaN.

* * * * *